(12) United States Patent
Sugiyama et al.

(10) Patent No.: US 6,472,699 B1
(45) Date of Patent: Oct. 29, 2002

(54) PHOTOELECTRIC TRANSDUCER AND MANUFACTURING METHOD OF THE SAME

(75) Inventors: Iwao Sugiyama; Hiroshi Goto, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/689,587

(22) Filed: Oct. 13, 2000

(30) Foreign Application Priority Data

Nov. 29, 1999 (JP) .......................................... 11-338457

(51) Int. Cl.⁷ ............................................ H01L 31/068
(52) U.S. Cl. ...................................... 257/292; 257/458
(58) Field of Search ................................ 257/458, 292

(56) References Cited

U.S. PATENT DOCUMENTS

| | | |
|---|---|---|
| 5,841,126 A | 11/1998 | Fossum et al. |
| 5,977,576 A | 11/1999 | Hamasaki |
| 6,072,206 A | * 6/2000 | Yamashita et al. .......... 257/443 |

\* cited by examiner

*Primary Examiner*—Jerome Jackson
(74) *Attorney, Agent, or Firm*—Armstrong, Westerman & Hattori, LLP

(57) ABSTRACT

A photoelectric transducer comprises elements including P- and N-type regions to perform photoelectric conversion using photovoltaic effect of the P-N junction, and MOS transistors disposed around each element. A P-type well on which the MOS transistors are formed, has a higher impurity concentration than the P-type region. The P-type region has an impurity concentration distribution in which the concentration first increases gradually in the direction toward the interior, and then decreases gradually after a predetermined point of depth, and the maximum peak value of the concentration at the predetermined point is lower than the maximum peak value of the concentration of the P-type well. It becomes possible to improve sensitivity and reduce leakage current, besides, to realize a considerable reduction in cross talk with an adjacent pixel. A high-performance and highly-reliable photoelectric transducer can be obtained thus.

6 Claims, 8 Drawing Sheets

FIG. 3
(a)
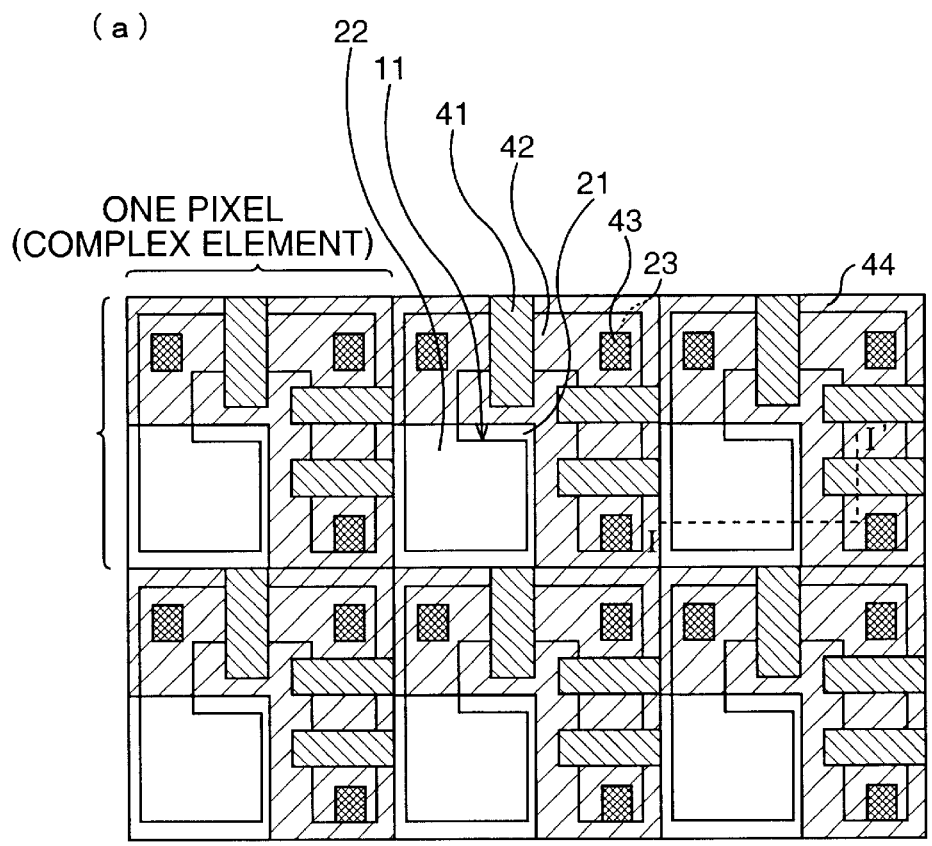
☐ LOW-CONCENTRATION WELL REGION
(PHOTOELECTRIC CONVERSION PORTION)
▨ HIGH-CONCENTRATION WELL REGION
(TRANSISTOR PORTION)
(b)
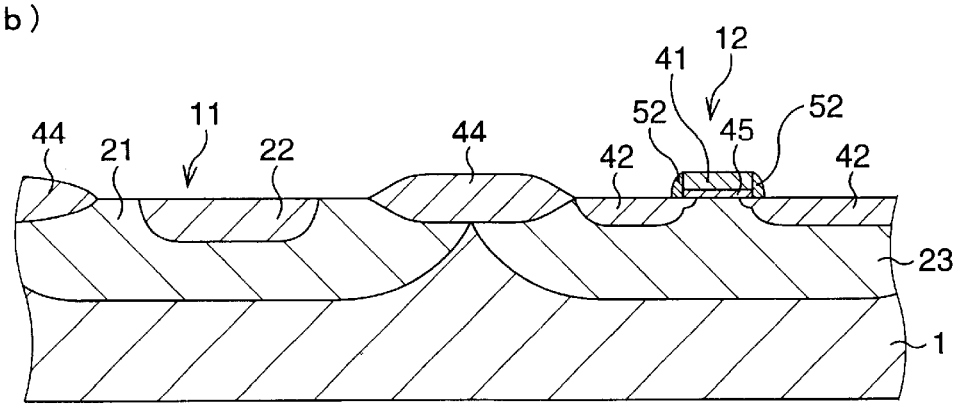

PHOTOELECTRIC CONVERSION ARRAY — 12
— 11
PHOTOELECTRIC CONVERSION PORTION
TRANSISTOR PORTION

PHOTOELECTRIC TRANSDUCER AND MANUFACTURING METHOD OF THE SAME

BACKGROUND OF THE INVENTION

1. Field of the Invention

The present invention relates to photoelectric transducers with elements each of which performs photoelectric conversion (hereinafter, referred to as photoelectric conversion element) using photovoltaic effect of a P-N junction of a semiconductor, in particular, to improvements in performance of photoelectric transducers in which such elements are arranged into a two-dimensional matrix.

2. Description of the Related Art

Semiconductor solid-state image pickup devices are currently used in various fields of image pickup. Particularly in recent years, there is a growing tendency toward cost and size reduction and system integration, based on the more minute design rule. Solid-state image pickup devices can be applied to various fields, e.g., home electronic devices such as video recorders, information terminals, and simplified imagers.

Photoelectric conversion elements are the most principal components of such a solid-state image pickup device. The mainstream of such elements is in those using photovoltaic effect of a P-N junction of a semiconductor. They are roughly classified into CCD type and CMOS type in accordance with a difference in method for reading out signals obtained by photoelectric conversion. In CCD type, electric charges obtained by photoelectric conversion are transferred to the external through a charge coupled device (CCD) formed in a semiconductor chip. In CMOS type, electric charges obtained by photoelectric conversion are converted in a CMOS device into a voltage signal to output.

CCD type solid-state image pickup devices have been mainly used hitherto because of high sensitivity and little noise. Such CCD type solid-state image pickup devices, however, have drawbacks, e.g., that the power consumption is much, and a separate chip is required for signal processing circuits. Contrastingly, CMOS type solid-state image pickup devices have the advantages that the power consumption is little, and signal processing circuits indispensable to such a solid-state image pickup device can easily be integrated on the same chip. For this reason, cases of adopting CMOS type have increased. In order to make such advantages of CMOS type more efficient, it has been desired that the portion for performing photoelectric conversion, i.e., a photoelectric transducer, (hereinafter, referred to as photoelectric conversion portion), is manufactured by a minute process similar to that for peripheral signal processing circuits, so that the highly-minute peripheral signal processing circuits can easily be incorporated.

When the photoelectric conversion portion is manufactured by a minute process equivalent to that for various peripheral signal processing circuits comprising a solid-state image pickup device, however, the following problems arise because the impurity concentration in a well increases with making the process standard the more minute.

(a) As the impurity concentration in a well increases, the lateral location of a P-N junction shifts toward the surface area, and the depletion layer of the P-N junction becomes narrower. The efficiency of converting light energy into electric signals is very high in such a depletion layer. Thus the decrease in width of the depletion layer causes a reduction in sensitivity.

(b) The decrease in width of the depletion layer and the increase in impurity concentration in the well as described in (a), causes the strength of electric field at the P-N junction to increase. The increase in field strength causes an increase in tunnel current, which is a component of a P-N junction leakage current, through carrier trapping centers. This causes an increase in dark current level of the image pickup device.

In addition to those, a simple application of a minute process equivalent to that for peripheral circuits, to the photoelectric conversion portion, causes the following optical problem.

(c) In a general CMOS process, P- or N-type wells are almost uniformly provided in a semiconductor substrate. If such a process is applied to the photoelectric conversion portion, it may cause the phenomenon that some of carriers generated under a P-N junction by photoelectric conversion, flow into an adjacent pixel. The leakage of carriers to the adjacent pixel (cross talk) causes a reduction in resolution in case of monochrome image, besides, a mixture of colors in case of color image.

An example of improvement for such cross talk is disclosed in Japanese Patent Application No. 9-232555 (1997). It proposes that an impurity layer (N type) on the substrate surface side of a P-N junction which functions as a light-receiving diode, is so formed as to have the higher impurity concentration the nearer to the substrate surface. In this method, however, because the P-N junction of the light-receiving diode must be formed by, e.g., ion implantation process, the number of steps of manufacturing process increases. Besides, it is hard to be compatible with formation of a shallow junction indispensable to a minute CMOS process.

As described above, conventionally, even if a CMOS type solid-state image pickup device whose power consumption is little and which is easy to manufacture coordinately with indispensable peripheral signal processing circuits, is desired to be adopted, serious problems have not yet been solved that the above-described various reductions in performance are brought about due to an increase in impurity concentration in a well as the device is made minute.

SUMMARY OF THE INVENTION

It is an object of the present invention to provide high-performance and highly-reliable photoelectric transducers with improved sensitivity and reduced leakage current in which cross talk with an adjacent pixel is considerably reduced in case of application to CMOS type solid-state image pickup devices.

It is another object of the present invention to provide manufacturing methods of such photoelectric transducers.

A photoelectric transducer according to the present invention comprises a photoelectric conversion element which comprises a first conductivity type region and a second conductivity type region surrounding the first conductivity type region, to perform photoelectric conversion using photovoltaic effect of a P-N junction between the first and second conductivity type regions; and a second conductivity type well surrounding the photoelectric conversion element, and having a higher impurity concentration than the second conductivity type region.

On the well, a semiconductor element D1 such as a MOS transistor may suitably be formed.

It is suitable to make up a photoelectric conversion element array from such photoelectric conversion elements, and provide peripheral circuits comprising semiconductor elements D2 (e.g., CMOS transistors). In this case, since each semiconductor element D1 in each photoelectric conversion element and each semiconductor element D2 in each peripheral circuit have the same basic construction (gate electrode, source and drain, etc.), they can be formed almost in the same process.

The impurity concentration distribution in the second conductivity type region of the photoelectric conversion element is preferably set as follows. That is, the impurity concentration first increases gradually in the direction toward the interior, and then decreases gradually after a predetermined point of depth. Besides, the maximum peak value of the impurity concentration at the predetermined point of depth is lower than the maximum peak value of the impurity concentration of the well.

A manufacturing method of a photoelectric transducer according to the present invention comprises steps of: introducing second conductivity type impurities into a semiconductor substrate to form a second conductivity type region; introducing second conductivity type impurities into a region of the semiconductor substrate surrounding the second conductivity type region to form a well, such that the well has a higher impurity concentration than the second conductivity type region; and introducing first conductivity type impurities into a surface region of the second conductivity type region to form a first conductivity type region.

Also in this case, it is suitable to form a semiconductor element D1 on the well, to form semiconductor elements D2 for a peripheral circuit, or to control the impurity concentration distribution in the second conductivity type region of the photoelectric conversion element as described above.

According to the present invention, since the well having a high impurity concentration is provided to surround the photoelectric conversion element, the well functions as a potential barrier to carriers from a region (e.g., another photoelectric conversion element) adjacent to the photoelectric conversion element. Leakage of carriers between neighboring photoelectric conversion elements is suppressed thereby.

Besides, when the second conductivity type region of the photoelectric conversion element has an impurity concentration distribution in which the impurity concentration first increases gradually in the direction toward the interior, and then decreases gradually after a predetermined point of depth, the impurity concentration at the P-N junction can be set low. This brings about a wide depletion layer, and so makes it possible to improve sensitivity and reduce leakage current. Further in this case, by controlling the maximum peak value of the impurity concentration at the predetermined point of depth to be lower than the maximum peak value of the impurity concentration of the well, the above function of the well as a potential barrier can be insured more.

According to the present invention, since the well having a high impurity concentration is provided to surround the P-N junction type photoelectric conversion element, a considerable reduction in cross talk with an adjacent pixel can be realized when the present invention is applied to a CMOS type solid-state image pickup device. Besides, when the second conductivity type region of the photoelectric conversion element has an impurity concentration distribution in which the impurity concentration first increases gradually in the direction toward the interior, and then decreases gradually after a predetermined point of depth, and the maximum peak value of the impurity concentration at the predetermined point of depth is lower than the maximum peak value of the impurity concentration of the well, it becomes possible to improve sensitivity and reduce leakage current.

BRIEF DESCRIPTION OF THE DRAWINGS

FIG. 3 shows (a) an enlarged plane view of part of an array of photoelectric conversion elements, which are components of the solid-state image pickup device according to the embodiment, and (b) a sectional view taken along a broken line I–I' in (a);

DETAILED DESCRIPTION OF THE PREFERRED EMBODIMENTS

Hereinafter, an embodiment in which a photoelectric transducer according to the present invention is applied to a CMOS type solid-state image pickup device, will be described with reference to drawings.

Figure 1:
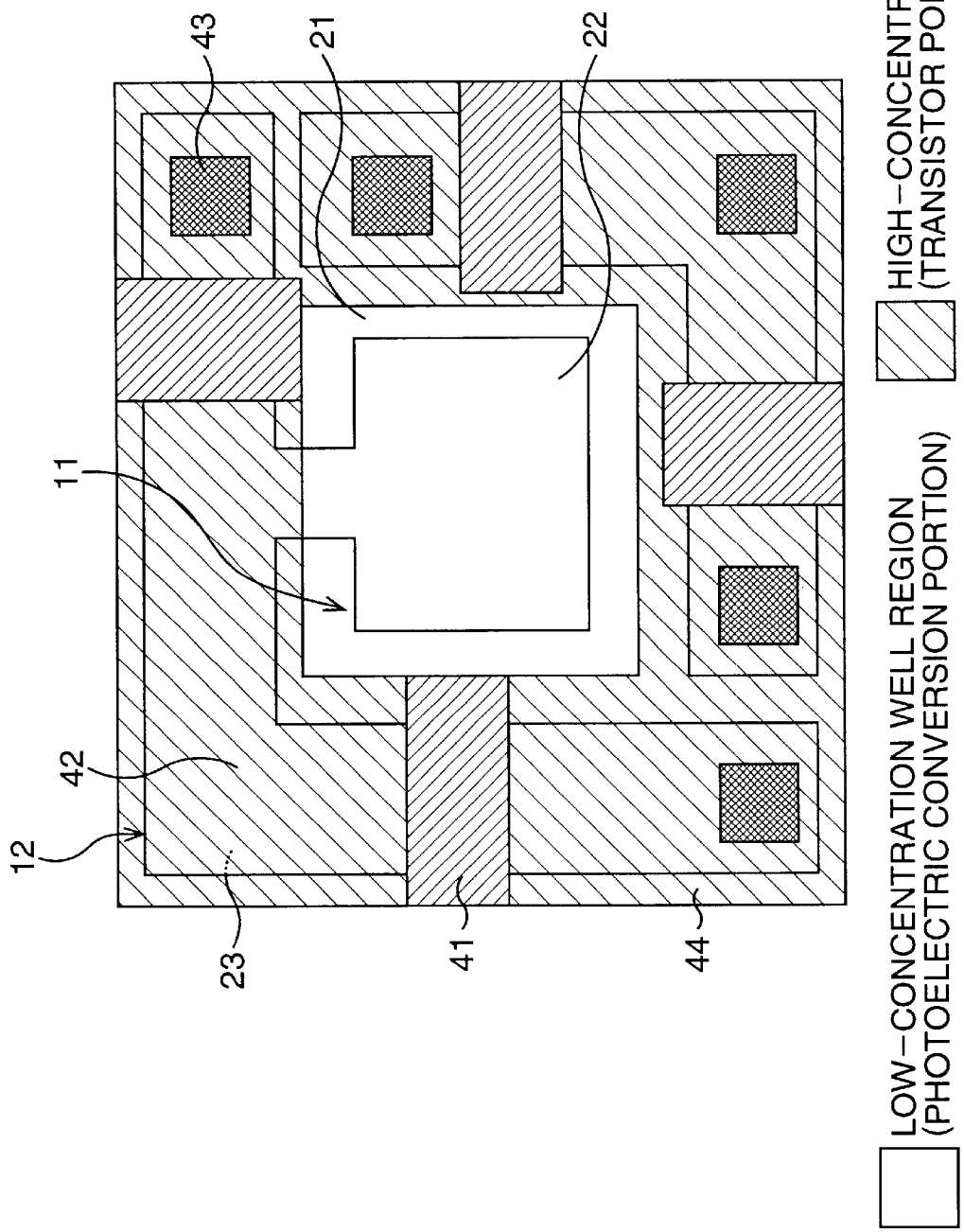
FIG. 1 is a schematic plane view of a specific example of photoelectric transducer according to the present invention.

FIG. 1 shows a specific example of construction of such a photoelectric transducer according to the present invention.

Referring to FIG. 1, the photoelectric transducer comprises a photoelectric conversion element 11 formed at the central area. The photoelectric conversion element 11 comprises a first conductivity type region (N-type region 22) formed in a surface region of a semiconductor substrate 1, and a second conductivity type region (P-type region 21) surrounding the first conductivity type region. Around the photoelectric conversion element 11, provided is a P-type well 23 having a higher impurity concentration than the P-type region 21. On the P-type well 23, formed are four semiconductor elements D1 (MOS transistors 12) each having a gate electrode 41 and N-type source and drain regions 42 with a leading electrode 43.

Figure 2:
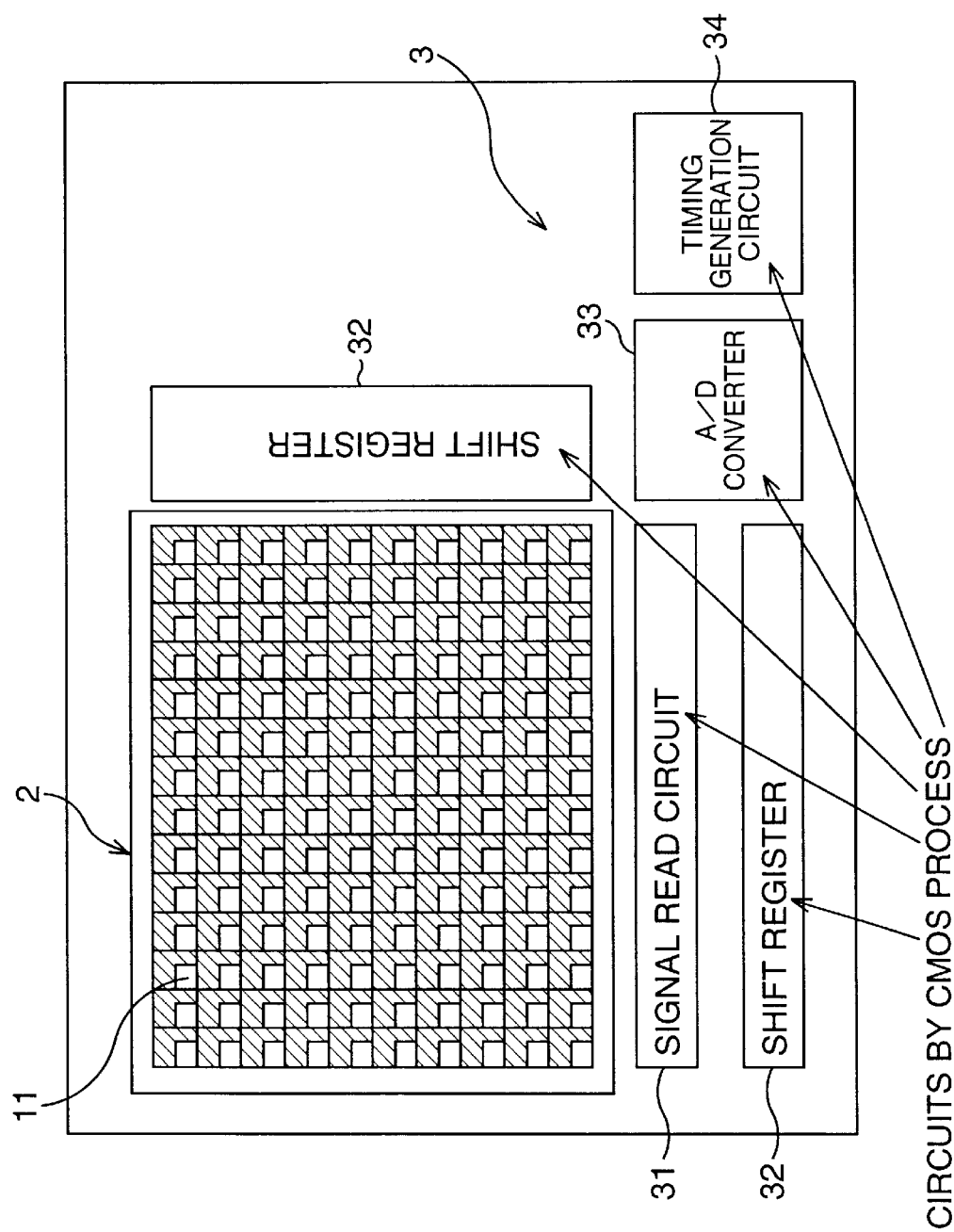
FIG. 2 is a schematic plane view of a solid-state image pickup device according to an embodiment of the present invention.

FIG. 2 shows a schematic plan view of the CMOS type solid-state image pickup device according to the embodiment.

The solid-state image pickup device comprises a photoelectric conversion element array (photoelectric conversion portion; photoelectric transducer) 2 which functions as a light receiving portion, on a semiconductor substrate (chip) 1. In the photoelectric conversion element array 2, photoelectric conversion elements 11 each of which functions as a pixel, are arranged into a matrix. The solid-state image pickup device further comprises peripheral signal processing circuits 3.

As shown in FIG. 3 ((a) plane view; (b) sectional view taken along a broken line I-I' in (a)), each pixel of the photoelectric conversion element array 2 comprises a photoelectric conversion element 11 which performs photoelectric conversion using photovoltaic effect of a P-N junction of a semiconductor, and three MOS transistors 12 so disposed as to surround the photoelectric conversion element 11 on two sides. The photoelectric conversion element 11 comprises a P-type region (well) 21, and an N-type region 22 formed in a central surface region of the P-type well. A p-N junction is formed between the P- and N-type regions 21 and 22. A P-type well 23 whose impurity concentration is higher than that of the P-type region 21, is so formed as to surround the photoelectric conversion element 11. The MOS transistors 12 are formed on this P-type well 23. Each MOS transistor 12 comprises a gate electrode 41 formed on a gate insulating layer 45 on the P-type well 23, and N-type source and drain regions 42 formed in the P-type well 23 on both sides of the gate electrode 41. One of the source and drain regions 42 is provided at its one end portion with a leading electrode 43. The P-type region 21 and the P-type well 23 are electrically isolated from each other with an element isolation structure 44 formed by, e.g., LOCOS process.

The peripheral signal processing circuits 3 comprise a pair of signal read circuits 31 in x and y directions for reading out a signal from a target photoelectric conversion element 11 of the photoelectric conversion element array 2; shift registers 32 for performing a sequence of signal processing operations; an A/D converter 33; a timing generation circuit 34 for generating a timing signal for read operation of the signal read circuits 31; and so on. Each of these components comprises CMOS transistors.

Figure 4:
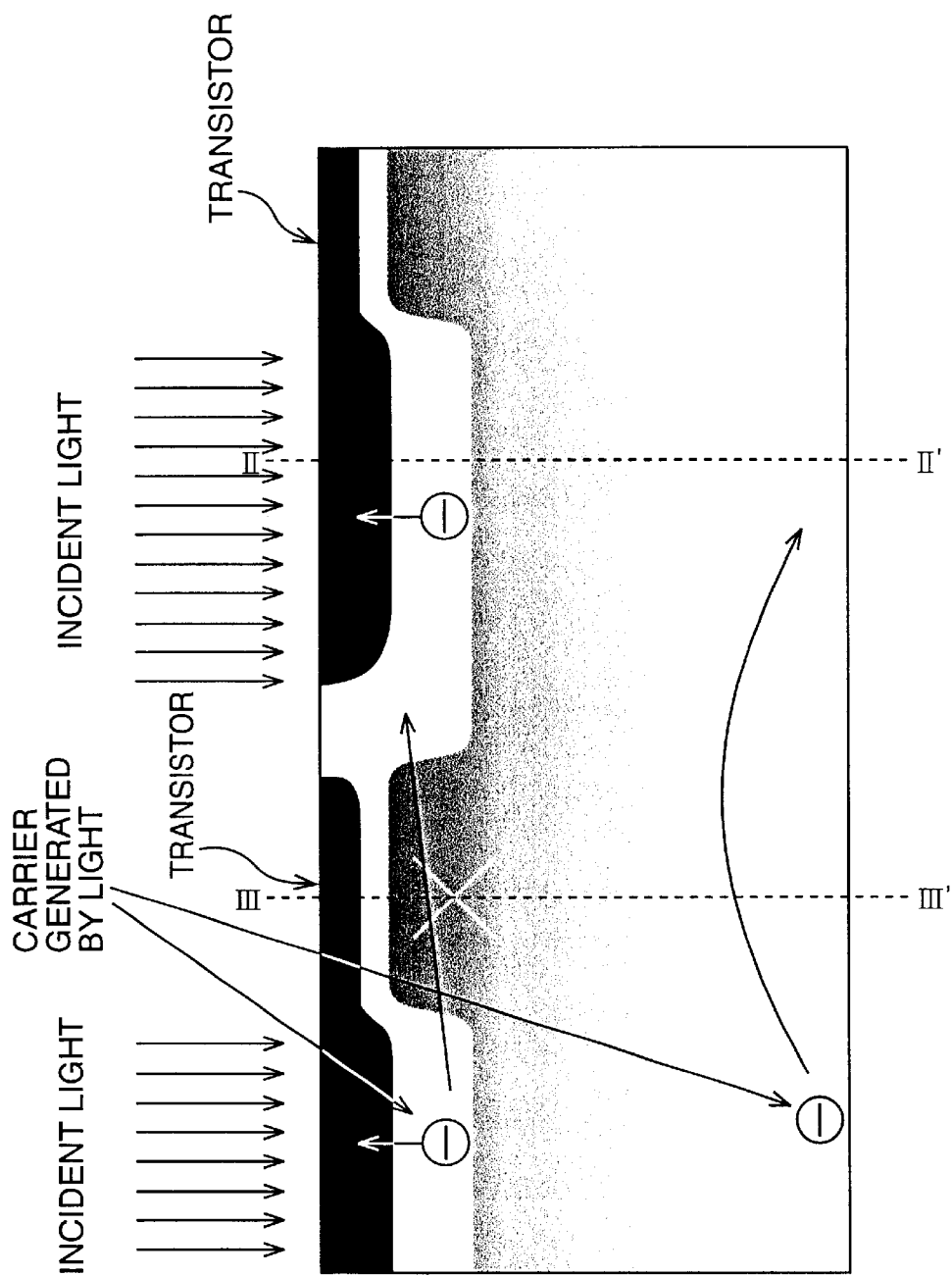
FIG. 4 is an imaginary sectional view for illustrating movements of generated carriers between neighboring photoelectric conversion elements.
Figure 5A:
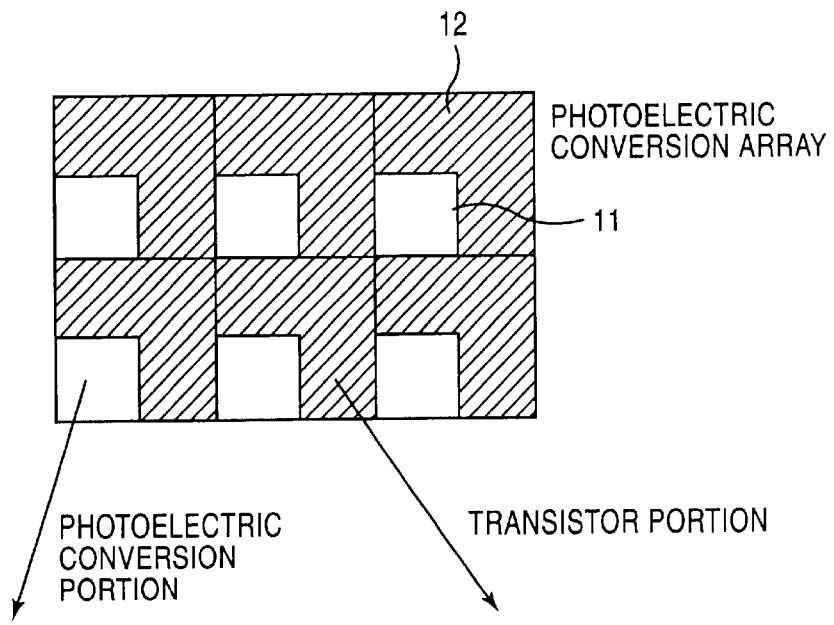
FIG. 5 shows graphs of relations between impurity concentration and depth, of (a) a photoelectric conversion element and (b) a MOS transistor, respectively.
Figure 5B:
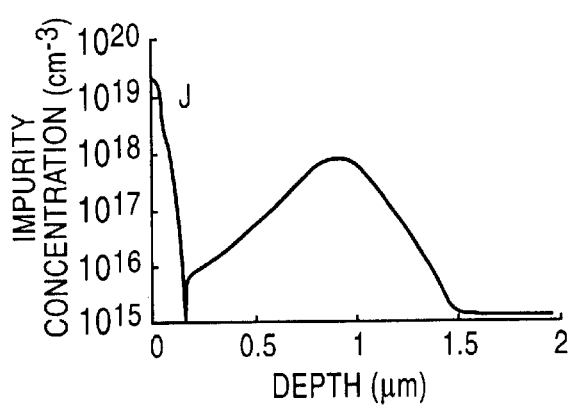
Figure 5C:
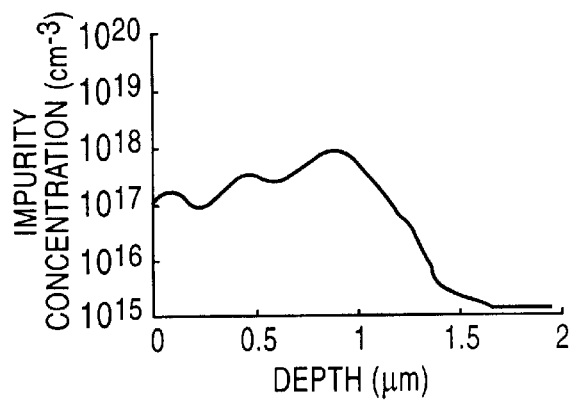

FIG. 4 is an imaginary sectional view for illustrating movements of carriers between neighboring photoelectric conversion elements 11. FIG. 5 shows graphs of relations between impurity concentration and depth, of a photoelectric conversion element 11 and a MOS transistor 12, respectively. In FIG. 5, (a) shows an impurity concentration distribution along the depth in the P- and N-type regions 21 and 22 of a photoelectric conversion element 11, which corresponds to a broken line II–II' in FIG. 4; and (b) shows an impurity concentration distribution along the depth mainly in the P-type well 23 of a MOS transistor 12, which corresponds to a broken line III–III' in FIG. 4.

As shown in (a) of FIG. 5, the impurity concentration distribution of the photoelectric conversion element 11 roughly comprises two parts. In the direction from the surface toward the interior of the substrate, an N-type impurity concentration distribution in the N-type region 22 of the surface region appears first. A P-type impurity concentration distribution in the P-type region 21 then appears after the P-N junction as the boundary J. In the P-type impurity concentration distribution in the P-type region 21, the concentration first gradually increases in the direction toward the interior, and then decreases after a predetermined depth, as shown in (a) of FIG. 5. In comparison with (b) of FIG. 5, the impurity concentration in the P-type region 21 is regulated to be lower than that in the P-type well 23 at every point of depth. Thus the maximum peak value of the impurity concentration in the P-type region 21 is lower than that in the P-type well 23.

By provision of the P-type well 23 at high impurity concentrations surrounding the photoelectric conversion element 11, as shown in FIG. 4, the P-type well 23 functions as a potential barrier to carriers generated in the photoelectric conversion element 11. Carriers generated in a deep portion of the substrate are thereby prevented from flowing in an adjacent photoelectric conversion element 11. Thus leakage of carriers between neighboring photoelectric conversion elements 11 is reduced. This carrier interception effect causes unnecessary carriers to be introduced into the interior of the substrate, so it becomes more effective by setting the maximum peak value of the impurity concentration in the P-type well 23 to be higher than that in the P-type region 21, as shown in FIG. 5.

Besides, by controlling the impurity concentration of the photoelectric conversion element 11 as shown in (a) of FIG. 5, the impurity concentration at the P-N junction J can be set at a low value. A wide depletion layer can be obtained thereby. This makes it possible to improve sensitivity and reduce leakage current.

Actually, a solid-state image pickup device according to this embodiment and a conventional CMOS type solid-state image pickup device were compared in some performances. The below table 1 shows the result. In the solid-state image pickup device according to this embodiment, sensitivity (photoelectric current) was improved by about 50%. Cross talk and dark current were reduced to ⅛ and ⅓, respectively.

TABLE 1

| device | photoelectric current (pA) | cross talk (%) | dark current (relative value) |
| --- | --- | --- | --- |
| prior art | 6 | 8 | 1 |
| embodiment | 8 | 1 | 0.3 |

Next, a manufacturing method of the solid-state image pickup device according to this embodiment will be described with reference to FIGS. 6 to 8. Each figure of FIGS. 6 to 8 corresponds to (b) of FIG. 3, which is a sectional view taken along a broken line I–I' in (a).

Figure 6A:
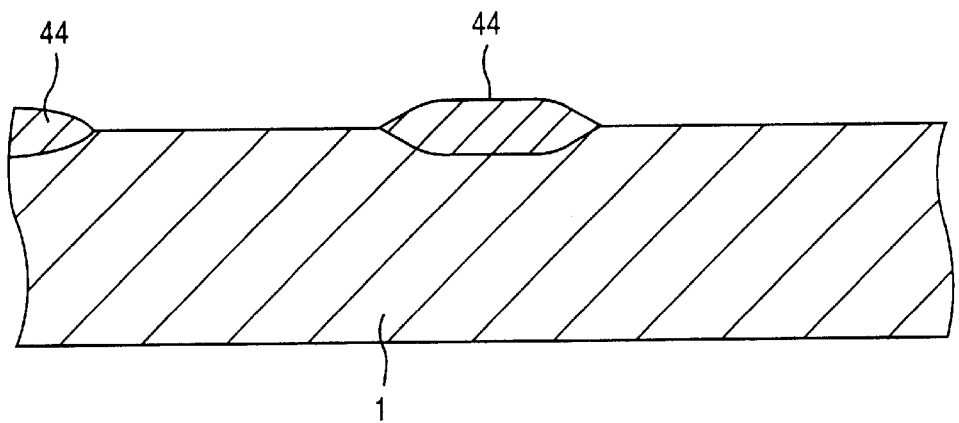
FIGS. 6(a) to 6(c) are schematic sectional views showing manufacturing steps in order, of the solid-state image pickup device according to the embodiment.

First, as shown in FIG. 6(a), on a P-type silicon substrate 1 or a silicon substrate provided thereon with a P-type epitaxial layer, oxide regions of a thickness of about 200 to 400 nm to be element isolation structures 44 are formed by a selective oxidation method (LOCOS method). In this case, in place of the LOCOS method, usable is a so-called shallow trench isolation method in which a shallow trench of a depth of about 400 nm is formed at each element isolation area by photolithography and anisotropic etching, the trench is then filled with oxide by CVD (Chemical Vapor Deposition) method, and then excess portions of the oxide are removed by CMP (Chemical Mechanical Polishing) method.

Figure 6B:
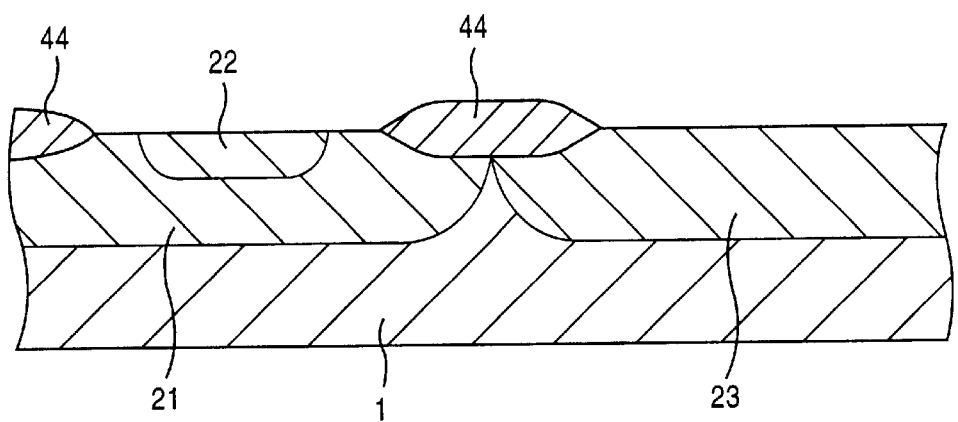

Next, as shown in FIG. 6(b), P- and N-type regions 21 and 22 of each photoelectric conversion element 11 as a light-receiving portion, a P-type well 21 on which MOS transistors 12 are to be formed, and N- and P-type wells (not shown) for peripheral circuits including peripheral signal processing circuits 3, are formed in a proper order by ion implantation processes. Each ion implantation process is performed with a proper photoresist mask predetermined portions of which are opened to correspond to the respective target areas of the ion implantation. By each ion implantation process, N- or P-type impurities are implanted in the substrate at predetermined concentrations.

In this case, at the portion to be a light-receiving portion, an ion implantation process to form the P-type region 21 is first performed with controlling the accelerating energy and the dose such that the P-type region 21 has an impurity concentration distribution wherein the concentration first increases gradually in the direction from the surface toward the interior of the substrate, and then gradually decreases after a predetermined point of depth. Next, an ion implantation process to form the N-type region 22 is performed with controlling the accelerating energy and the dose such that the N-type region 22 has an impurity concentration distribution wherein the concentration gradually increases in the direction from the surface toward the interior of the substrate. By these ion implantation processes, such an impurity concentration distribution as shown in (a) of FIG. 5 can be realized.

At the portion to be the P-type well 23, an ion implantation process to form the P-type well 23 is performed in the state that the above light-receiving portion side is covered with a photoresist mask. The accelerating energy and the dose of the ion implantation process is so controlled that the P-type well 23 has an impurity concentration higher than that of the P-type region 21 at every point of depth. P-type impurities for controlling threshold values are then introduced by an ion implantation process into portions on which MOS transistors 12 and peripheral circuits are to be formed. In the portion on which MOS transistors 12 are to be formed, such an impurity concentration distribution as shown in (b) of FIG. 5 is realized thereby.

After this, the MOS transistors 12 and CMOS transistors in peripheral circuits 31 to 34 are formed. In these transistors, the corresponding parts to one another are formed at once in the same process. Hereinafter, only the manufacturing process of a MOS transistor 12 will be described with reference to drawings.

Figure 6C:
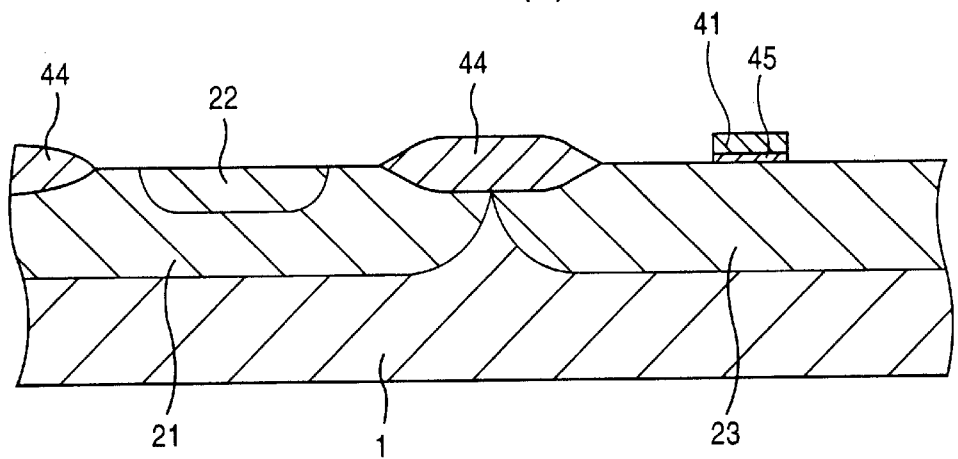

First, as shown in FIG. 6(c), an oxide film of a thickness of several nm to about 10 nm is formed by, e.g., a thermal oxidation process, on the area in which the MOS transistor 12 is to be formed. A polysilicon film of a thickness of about 100 to 300 nm is then formed on the oxide film by, e.g., a CVD process. The polysilicon film and the oxide film are then patterned by photolithography and anisotropic etching to form a gate electrode 41 and a gate insulating film 45, respectively. In this case, the polysilicon film may have been doped into, e.g., N-type. Besides, a silicide, such as WSi, and an insulating layer of an oxide may have been overlaid on the polysilicon film. A person skilled in the art will easily implement such modifications. Please note that the gate insulating film and the gate electrode of each of the CMOS transistors in the peripheral circuits can be formed by the same manner as described above in the same process.

Figure 7A:
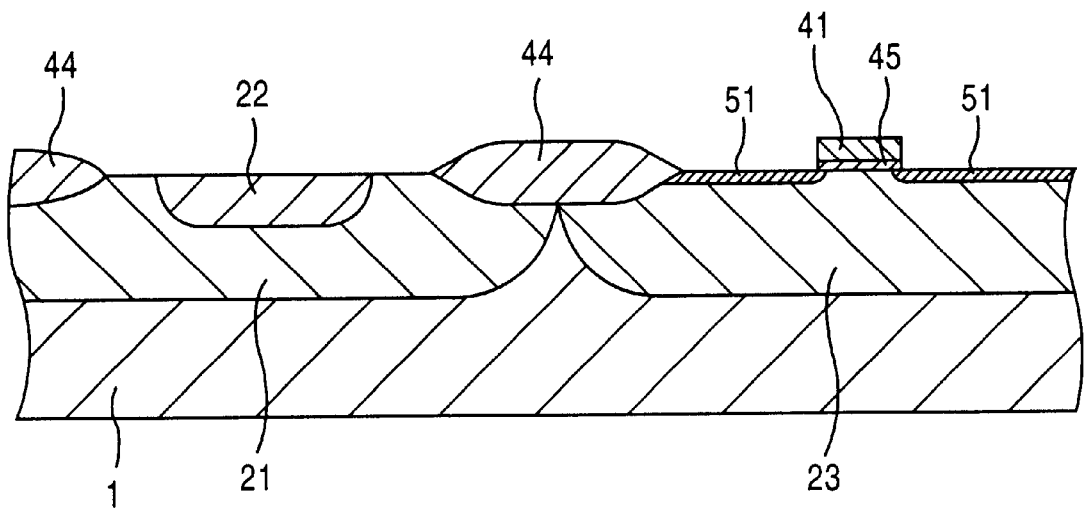
FIGS. 7(a) and 7(b) are schematic sectional views showing manufacturing steps in order, subsequent to FIG. 6(c)

Next, as shown in FIG. 7(a), N-type impurities are introduced into surface regions of the P-type well 23 at a relatively low concentration by an ion implantation process using the gate electrode 41 as a mask. Low impurity concentration regions 51 which are to be LDD regions, are thereby formed on both sides of the gate electrode 41.

Figure 7B:
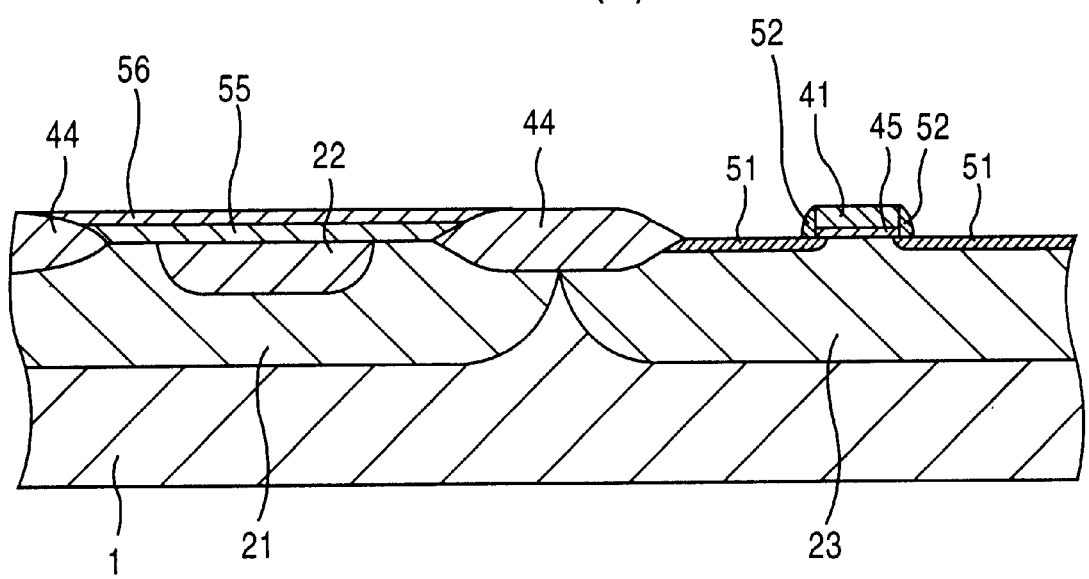

Next, as shown in FIG. 7(b), an oxide film 55 of a thickness of about 80 to 100 nm is formed by, e.g., a CVD process to cover the gate electrode 41 and the photoelectric conversion element 11. The oxide film 55 is then anisotropically etched through its whole upper surface so that parts of the oxide film 55 remain only on both sides of the gate electrode 41 to form side walls 52. At this time, the anisotropic etching process is performed in the state that the portion of the oxide film 55 on the photoelectric conversion element 11 is covered with a photoresist 56. Thus the portion of the oxide film 55 on the photoelectric conversion element 11 is prevented from being etched off.

Figure 8A:
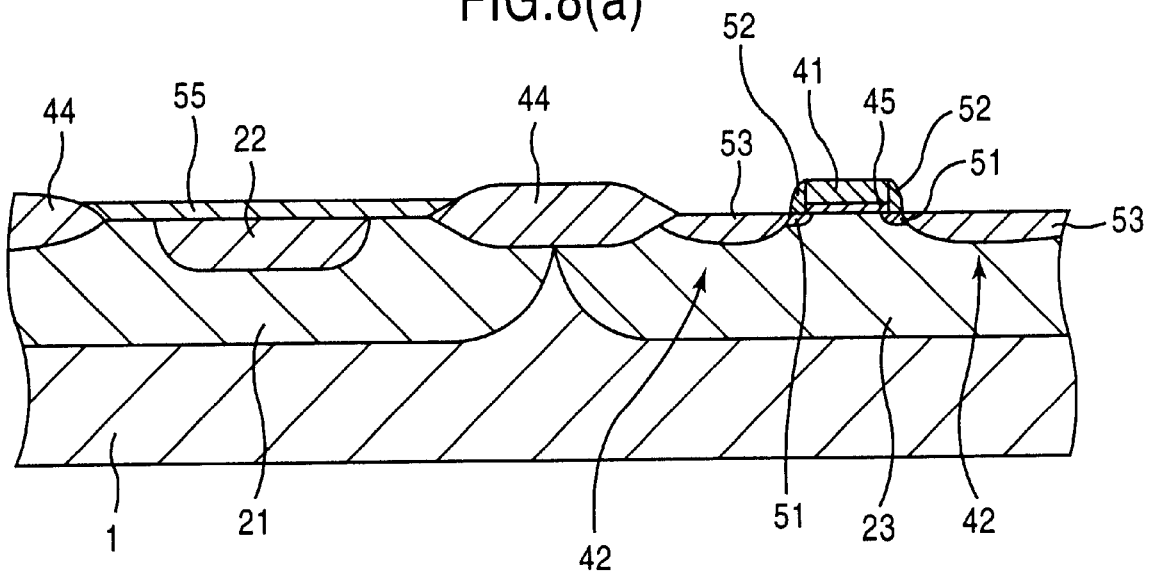
FIGS. 8(a) and 8(b) are schematic sectional views showing manufacturing steps in order, subsequent to FIG. 7(b)

Next, as shown in FIG. 8(a), N-type impurities are introduced into surface regions of the P-type well 23 at a relatively high concentration by an ion implantation process using the gate electrode 41 and the side walls 52 as a mask. High impurity concentration regions 53 are thereby formed on both sides of the gate electrode 41. At this time, on either side of the gate electrode 41, the portion of the low impurity concentration region 51 outside the side wall 52 is incorporated with the high impurity concentration region 53. Source and drain regions 42 are thereby formed. After this, the second side walls may be formed if necessary.

Figure 8B:
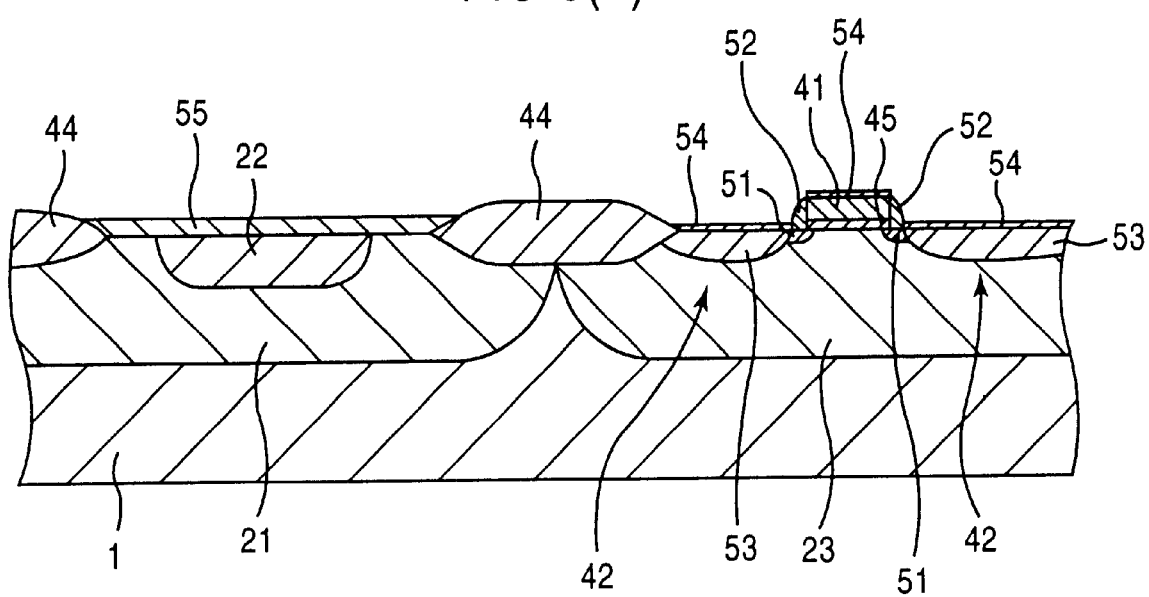

Next, as shown in FIG. 8(b), the photoresist 56 is removed by, e.g., an ashing process. Silicide 54 with metal such as Co or Ti is then formed by a known salicide technique on the exposed source and drain regions 42, and on the surface of the gate electrode 41 if the surface is exposed. At this time, since the oxide film 55 remains on the surface of photoelectric conversion element 11, no silicide 54 is formed thereon. This portion is, therefore, kept in an optically transparent state. As for the CMOS transistors in the peripheral circuits, their source and drain regions can be formed simultaneously with the above source and drain regions 42 in the same process.

After this, performed are known processes to form an insulating interlayer covering the whole surface, to form contact holes conducting to the source and drain regions 42 and the like, to open the portions in which leading electrodes 43 are formed, to form interconnection layers, etc. A solid-state image pickup device is completed thus.

As described above, according to this embodiment, realized are high-performance and highly-reliable solid-state image pickup devices with improved sensitivity and reduced leakage current in which cross talk with an adjacent pixel is considerably reduced.

What is claimed is:

1. A photoelectric transducer comprising:
    a photoelectric conversion element which comprises a first conductivity type region and a second conductivity type region covering said first conductivity type region, to perform photoelectric conversion using a photovoltaic effect of a P-N junction between said first and second conductivity type regions; and
    a second conductivity type well surrounding said photoelectric conversion element, and having a higher impurity concentration than said second conductivity type region;
    wherein said second conductivity type region has an impurity concentration distribution in which an impurity concentration first increases gradually in the direction toward the interior, has the maximum peak value of the impurity concentration at a predetermined point of depth, and then decreases gradually after the predetermined point of depth.

2. A transducer as set forth in claim 1, wherein a semiconductor element is formed on said well.

3. A transducer as set forth in claim 2, further comprising:
    another photoelectric conversion element isolated from said photoelectric conversion element by said well; and
    a peripheral circuit comprising semiconductor elements each having the same basic construction as that of said semiconductor element on said well.

4. A photoelectric transducer comprising:
    a photoelectric conversion element which comprises a first conductivity type region and a second conductivity type region covering said first conductivity type region, to perform photoelectric conversion using photovotaic effect of a P-N junction between said first and second conductivity type regions; and
    a second conductivity type well surrounding said photoelectric conversion element, and having a higher impurity concentration than said second conductivity type region,
    wherein said second conductivity type region of said photoelectric conversion element has an impurity concentration distribution in which the impurity concentration first increases gradually in the direction toward the interior, and then decreases gradually after a predetermined point of depth, and the maximum peak value of said impurity concentration at said predetermined point of depth is lower than the maximum peak value of the impurity concentration of said well.

5. A transducer as set forth in claim 4, wherein a semiconductor element is formed on said well.

6. A transducer as set forth in claim 4, further comprising:
   another photoelectric conversion element isolated from said photoelectric conversion element by said well; and
   a peripheral circuit comprising semiconductor elements each having the same basic construction as that of said semiconductor element on said well.

\* \* \* \* \*